(12) United States Patent
Meulenbroeks

(10) Patent No.: US 6,642,860 B2
(45) Date of Patent: Nov. 4, 2003

(54) DATA COMPRESSION METHOD AND SYSTEM THAT USE A REGRESSIVE STRING REFERENCE, POINTING TO AND DELIMITING AN ENCODED POINTEE STRING, AND IDENTIFY THE REFERENCE THROUGH A SIGNALLING ELEMENT, AN ENCODING DEVICE AND A DECODING DEVICE ARRANGED FOR IMPLEMENTING THE METHOD, AND A STORAGE MEDIUM PROVIDED WITH INFORMATION PRODUCED BY SUCH ENCODING DEVICE AND/OR ARRANGED FOR DECODING BY SUCH DECODING DEVICE

(75) Inventor: Franciscus Johannes Henricus Maria Meulenbroeks, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/042,462

(22) Filed: Jan. 8, 2002

(65) Prior Publication Data

US 2002/0091886 A1 Jul. 11, 2002

(30) Foreign Application Priority Data

Jan. 11, 2001 (EP) .............................. 01200083

(51) Int. Cl.[7] .......................... H03M 7/34; H03M 7/38; G06F 15/16
(52) U.S. Cl. .......................... 341/51; 709/247
(58) Field of Search ...................... 341/51, 65; 375/240; 709/247, 330, 102, 201; 235/431; 345/622; 365/189.01; 711/6; 717/116, 140, 149

(56) References Cited

U.S. PATENT DOCUMENTS

| | | | | |
|---|---|---|---|---|
| 4,682,150 A | * | 7/1987 | Mathes et al. | ............... 235/431 |
| 5,010,344 A | * | 4/1991 | Nagy | ........................ 341/65 |
| 5,010,345 A | * | 4/1991 | Nagy | ........................ 341/65 |
| 5,179,378 A | * | 1/1993 | Ranganathan et al. | ........ 341/51 |
| 5,353,024 A | * | 10/1994 | Graybill | ....................... 341/51 |
| 5,592,512 A | * | 1/1997 | Spiess | ...................... 375/240 |
| 5,621,403 A | * | 4/1997 | Reznik | ........................ 341/51 |
| 5,640,158 A | * | 6/1997 | Kitazawa et al. | .............. 341/51 |
| 5,995,998 A | * | 11/1999 | Furlani et al. | ............... 709/102 |
| 6,178,461 B1 | * | 1/2001 | Chan et al. | .................. 709/247 |
| 6,594,683 B1 | * | 7/2003 | Furlani et al. | ............... 709/102 |

OTHER PUBLICATIONS

Salomon D, "Data Compression," 1998, Springer, pp. 104–106.*

Kuo et al, "Efficient Repetition Finder for Improving Dynamic Huffman Coding," 1997, IEEE, pp. 1363–1365.*

* cited by examiner

*Primary Examiner*—Patrick Wamsley
(74) *Attorney, Agent, or Firm*—Michael E. Belk

(57) ABSTRACT

Data is compressed through implementing the inserting of a regressive reference string scheme, each such reference replacing a particular data string through referring to an associated earlier data string of identical content. In particular, the regressive string reference item to an encoded object is inserted as being based on pointing and delimiting a pointee string, and identifying the reference item through an associated signalling element.

16 Claims, 4 Drawing Sheets

DATA COMPRESSION METHOD AND SYSTEM THAT USE A REGRESSIVE STRING REFERENCE, POINTING TO AND DELIMITING AN ENCODED POINTEE STRING, AND IDENTIFY THE REFERENCE THROUGH A SIGNALLING ELEMENT, AN ENCODING DEVICE AND A DECODING DEVICE ARRANGED FOR IMPLEMENTING THE METHOD, AND A STORAGE MEDIUM PROVIDED WITH INFORMATION PRODUCED BY SUCH ENCODING DEVICE AND/OR ARRANGED FOR DECODING BY SUCH DECODING DEVICE

BACKGROUND OF THE INVENTION

The invention relates to a method as recited in the preamble of claim 1. The art of data storage and transmission has recognized the advantages of data compression. A particularly advantageous compression scheme has been to conceptually replace a particular data string by an earlier occurrence of an unencoded, or rather decoded, data string that has exactly the same content. The signalling of such replacing is formulated as a relative pointer combined with an indication of the length of the replacing string. Now, a pointer-length pair will often have a greater length than a standard length character. At a subsequent decoding operation, this scheme will therefore necessitate a buffer for storing all earlier decoded information within the range of the pointer to allow the resolving of all back-references. Practical embedded systems will however often feature a scarcity in available RAM storage space that would serve as such buffer. This may imply an unacceptable cost level, or may even defeat the applying of this technology.

SUMMARY TO THE INVENTION

In consequence, amongst other things, it is an object of the present invention to allow diminishing the requirements for RAM storage space. Now, the present inventor has recognized a procedure that would realize an appreciable advantage by having the pointers referring back to earlier encoded objects or strings. One argument in case is that ROM storage will generally be amply available for storing encoded data, such as would be the case in many embedded systems. However, the above storage-related argument is not a prerequisite for attaining the various advantages of implementing the invention. The improved scheme will by and large obviate the need for buffering decoded data, and furthermore will allow for a certain amount of random accessibility. The invention especially envisages its application in relatively inexpensive appliances. In various situations, the invention will also allow for a higher compression factor. Furthermore, a pointer will often span multiple objects, that may include both original versions and pointer-length pairs, rather than only characters or other standard-length items. With the same pointer size, this feature allows using a larger pointing range and therefore, an improved compression rate. On the other hand, through keeping the same pointing range as before, the present invention will allow to use shorter pointers, and in consequence, will realize an improved compression rate as well. Trade-offs will likewise represent fortuitous implementations of the present invention.

Now therefore, according to one of its aspects the invention is characterized according to the characterizing part of Claim 1.

The invention also relates to a system for implementing a method as claimed in Claim 1, to an encoding device and to a decoding device arranged for implementing a method as claimed in Claim 1, and to a storage medium provided with information produced by such encoding device and/or arranged for decoding by such decoding device. Further advantageous aspects of the invention are recited in dependent claims.

BRIEF DESCRIPTION OF THE DRAWING

These and further aspects and advantages of the invention will be discussed more in detail hereinafter with reference to the disclosure of preferred embodiments, and in particular with reference to the appended Figures that show.

FURTHER CONCEPTUAL CONSIDERATIONS ON THE PRESENT INVENTION

Figure 1:
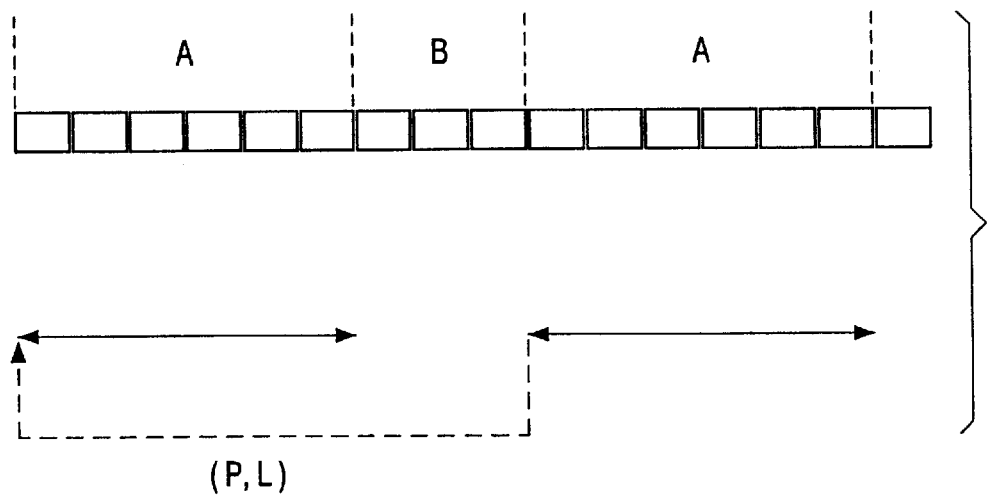
FIG. 1, a decoded data sequence provided with a pointer-length pair.

Now, the present invention allows to discriminate between standard length characters and pointer-length pairs through a specific signalling element. However, the invention also has a non-uniformity in length between standard-length characters on the one hand, and pointer-length pairs on the other hand. This aspect would render it less easy to refer backwards or in a regressive manner to find the pointee string, inter alia, because the pointer may refer back across both standard-length characters and also across further pointer-length pairs. However, the inventor has recognized various ways around this problem.

A first remedy therefor is to use pointers on the level of single bits, which in the case of eight bit characters will enlarge the length of a pointer by three bits. This approach is straightforward and fully feasible, but the greater length of a pointer will somewhat reduce the compression rate.

A second remedy therefor is to set the size of a pointer-length combination to a multiple of the length of standard characters. Also this approach is fully feasible, but it will limit the possible choices for the format. Furthermore, the use of the above signalling element means that for eight-bit characters the overall length of the pair will usually be 17 bits (two times eight plus one), which size may be larger than optimum.

A third solution therefor is to have pointer-length pairs alternating in sequence with standard length characters. This scheme presents an immediate solution to the problem of discriminating between data and pointer-length pairs, without a need for a discriminatory information to this effect. In case of two adjacent uncoded characters, a pointer indicating a distance of zero will then be interposed. This scheme allows immediate bidirectional decoding, whilst still maintaining the advantage of effecting the pointing in the encoded compressed space. However, the overall compression factor will be diminished through the necessity for frequently inserting the zero-distance pointers.

A fourth and presently preferred remedy therefor is however to provide the above signalling element or discriminatory information, such as a single bit, for all objects. Furthermore, the objects are divided into two parts, of which one part has a uniform length and contains at least the discriminatory information, whereas the second part of the object has the rest. The first part may then have the length of a standard character plus one bit, or rather, amount to just the signalling bit. Furthermore, the location of these two parts in storage is indicated by maintaining separate storage pointers, both for the standard length parts, and also for the remainder parts. The storage pointers relate to the storage configuration and are distinguished from the pointers contained in the pointer-length pairs themselves that relate to the data sequence configuration. The latter, in fact, relate to the data sequencew configuration.

The present inventor has therefore recognized that the dividing of the objects into at least two parts, and in particular, putting at least the signalization informations in a standard-length separate part and keeping a second part for a remainder, whilst maintaining for each part a secondary storage pointer, will allow to execute regressive decoding in an expeditious manner without the need for a relatively clumsy delimiting procedure for finding the lengths of all the various objects. This will be the presently preferred embodiment disclosed in particular hereinafter.

Regarding the length indication in the pointer-length pair, any particular embodiment must choose between having the length indicating the number of encoded objects, or rather the number of characters after decoding. The first approach will need fewer bits to indicate the length, but will less easily accommodate the encoding of substrings. The second approach favours the opposite.

A further extension of the preferred embodiment is the following. In first instance, the pointers should refer back to whole objects, to wit pointer-length pairs and characters, respectively. This will however not allow to refer back to an earlier string that comprises only part of an earlier reference, rather than the whole of such earlier reference. This problem can however be solved by replacing a pointer-length pair by a pointer-length-skip triple, wherein the skip indication will show which elements in the referenced item should be ignored, either before starting the copying of the item, or alternatively, which final elements of the item should be skipped for copying at the end.

Another solution is to specify the pointer in character units. In the case of a pointer-length pair, the length must then be checked.

Detailed Description of Preferred Embodiments

By way of background introduction, FIG. 1 illustrates a decoded data sequence, that consists of standard length characters, such as eight bits, shown as blocks. As shown, the sequence A, made up of six characters in this example, is followed by a three-character sequence B, after which the sequence A occurs a second time. Through inserting a pointer-length pair (P,L) instead of the second sequence A, a data compression is realized, provided that the pointer-length pair has on the average a shorter length than the replaced sequence. In consequence, the pointer here points to the pointee in the decoded data sequence. This means that the pointee must still be available in intermediate storage space when a decoder would detect the pointer-length pair.

Figure 2:
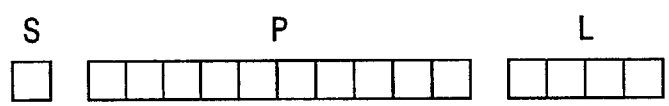
FIG. 2, a pointer format.

FIG. 2 illustrates an exemplary pointer-length pair format, to be used with the above earleir art, as well as with the present invention. The pointer-length pair consists of a signalling bit S that discriminates a pointer-length pair from other data, a ten-bit pointer P that indicates the offset to the sequence that must be copied (the pointee), and a four-bit length indication L that indicates the length of the string that must be copied. In consequence, in this embodiment the span of the pointer is 1024 characters, and the copied sequence may have up to 16 characters. Generally, standard-length characters should also have the signalling bit S.

Figure 3:
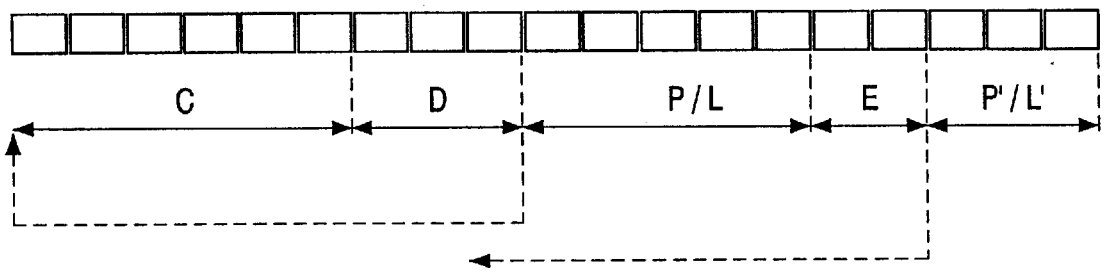
FIG. 3, an encoded data sequence according to the present invention.

FIG. 3 illustrates an encoded data sequence according to the preferred embodiment of the present invention, wherein the pointers will point to the correct location in the encoded data sequence. For simplicity, the above discriminatory element S for the standard characters as well as for the pointer-length pairs, has not been shown separately in the Figure. Now, the encoded sequence starts with objects C, D, followed by the pointer-length pair P/L that points to the start of C. In FIG. 3, the pointer-length format has not been made equal to that used in FIG. 2. The next-following pointer P'/L' may generally point across both one or more encoded sequences such as E, but may also point across one or more further pointer-length pairs such as P/L. Through the effect of the compression, this means that either the span of the pointer will have increased, so that generally a particular sequence may be copied more often, or that the pointer may be kept shorter, such as through having only 8 bits instead of ten.

Figure 4:
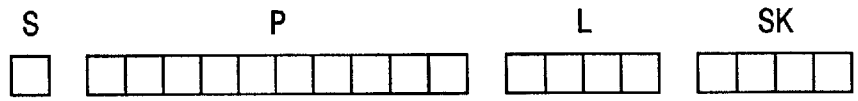
FIG. 4, a pointer format provided with a skip field.

FIG. 4 illustrates a pointer format provided with a skip field Sk, the remainder of the pointer-length combination being equal to that of FIG. 4. Here, the indication Sk defines a part of the pointee that should be skipped before copying the remainder of the pointee. Another solution would be that the indication Sk would define a part of the pointee after copying the preceeding part of the pointee. It has been found that such skipping may well increase the degree of flexibility of the inventive method.

Figure 5:
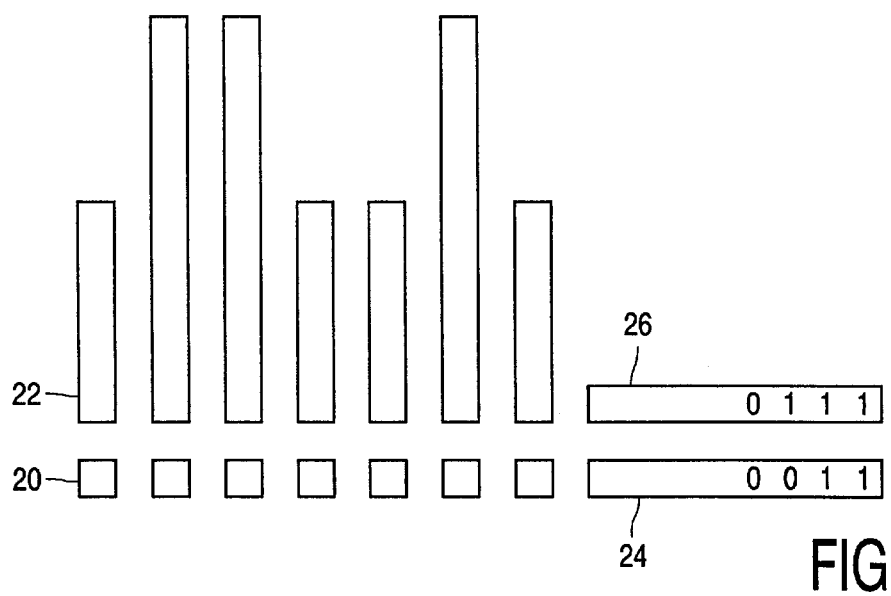
FIG. 5, the storage configuration in one embodiment.

FIG. 5 illustrates the storage configuration for the encoded data in one embodiment. In this case, there are seven objects, to wit, four standard length characters and three pointer-length pairs, each of these objects occupying its own conceptual column 22 in the Figure. Furthermore, each object has a signalling bit 20, that for the pointer-length pairs has a different value than for the standard length characters. Furthermore, for both storage parts, a separate storage pointer 24, 26 is being updated. For the signalling bits (24) only the number of pointer-length pairs is considered, so its value is "three" (binary . . . 011). For the other parts (26) all entries count, so the storage pointer's value is "seven" (binary . . . . 111). Alternatively, the part 26 could only be counting the number of pointer-length pairs, so that its count would then be "four" (binary . . . 100). It should be clear that the parts of the objects that comprise the signalling element, could also comprise part of the remainder of the object in question, such as to give the part the length of one character.

Figure 6:
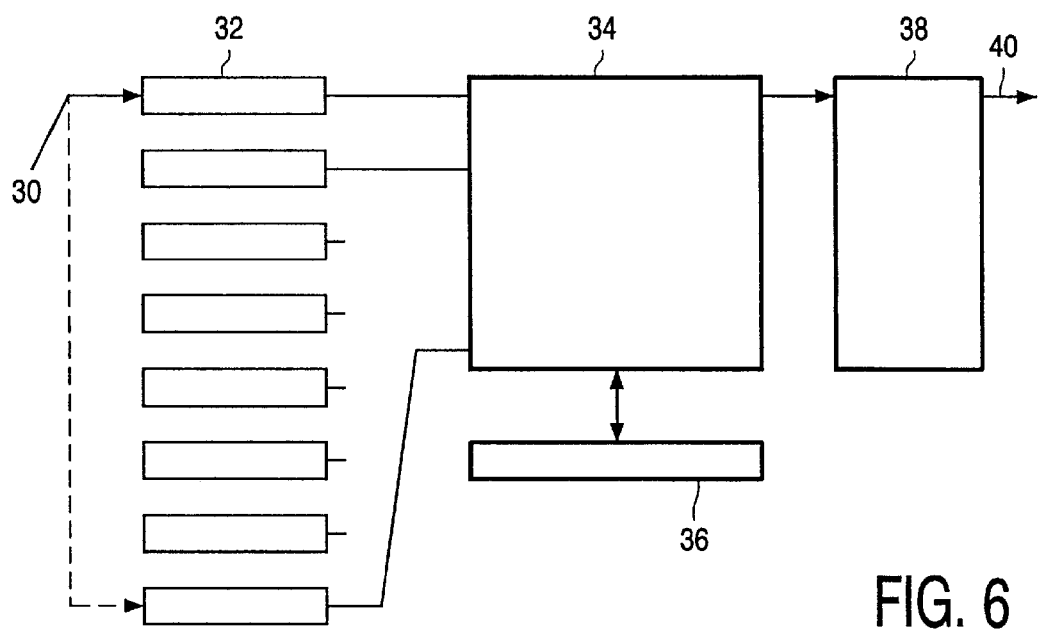
FIG. 6, an encoding arrangement.

FIG. 6 illustrates an encoding arrangement. Standard-size characters arrive on input 30 and are stored in storage array 32, that operates in the way of a FIFO. Concurrently with receiving a next character, processor 34 accesses storage array 32 to detect any character sequence within the pointer span of the embodiment that should be replaced by a pointer-length pair pointing to an earlier sequence that has exactly the same content. If found, the items in question in the storage array are replaced by the pointer-length pair, either physically or virtually, the latter by amending the address sequence. The pointer value is measured either in a number of encoded objects, or as a number of characters after encoding, as discussed earlier. Furthermore, register 36 stores the actual span between the first and last actual (physical or virtual, as the case may be), entries in array 32. In the case of overflow, those items are forwarded through device 38 for transmission on output 40, mass storage, or otherwise. Each object has its associated signalization bit, and furthermore, the stream is interspersed with the two types of storage pointers that have been discussed with reference to FIG. 5. The repetition rate of the interspersing of such storage pointers is generally a matter of design. Such would determine the random accessibility at an arbitrary point in the data sequence.

The algorithm used herein is of the greedy type, that undertakes to be applied at the execution. An extension of the above is however to have a first run for detecting all strings that should be replaced by a pointer-length pair, followed by a second run for actually executing the replacing.

Figure 7:
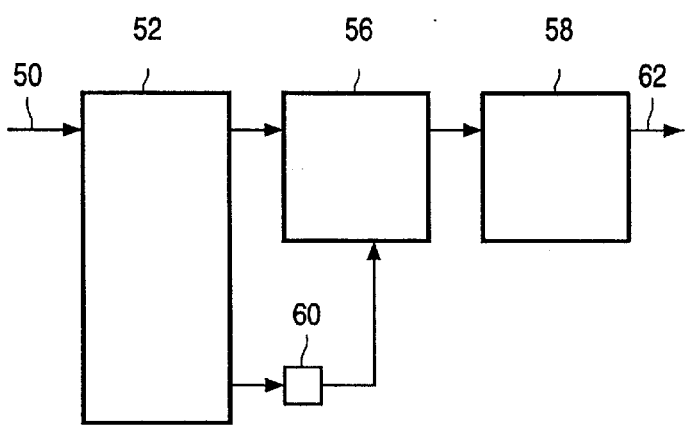
FIG. 7, a decoding arrangement.

FIG. 7 illustrates a decoding arrangement. Input 50 receives the stream of objects (characters and pointer-length pairs) and interspersed storage pointers, respectively. In consequence, an input detection facility not separately shown will know where to look for the bits that discriminate between standard characters and pointer-length pairs. Any standard-length character will be stored in storage array 52 and furthermore be read-out by processor 56 and forwarded to output device 58 for outputting on output 62 for further application. A pointer-length pair will activate binary detector 60, and processor 56 will thereupon read out the pointer-length pair and access the correct data sequence for outputting on output 62 as discussed earlier for the case of standard characters received. After finding a pointer-length pair, the address counter for the actual storage address is incremented with the appropriate value, so that the next pointer length pair will implement the correct address offset. Again, when coming outside the applicable address span for the pointer, the associated information is deleted or otherwise ignored.

Figure 8:
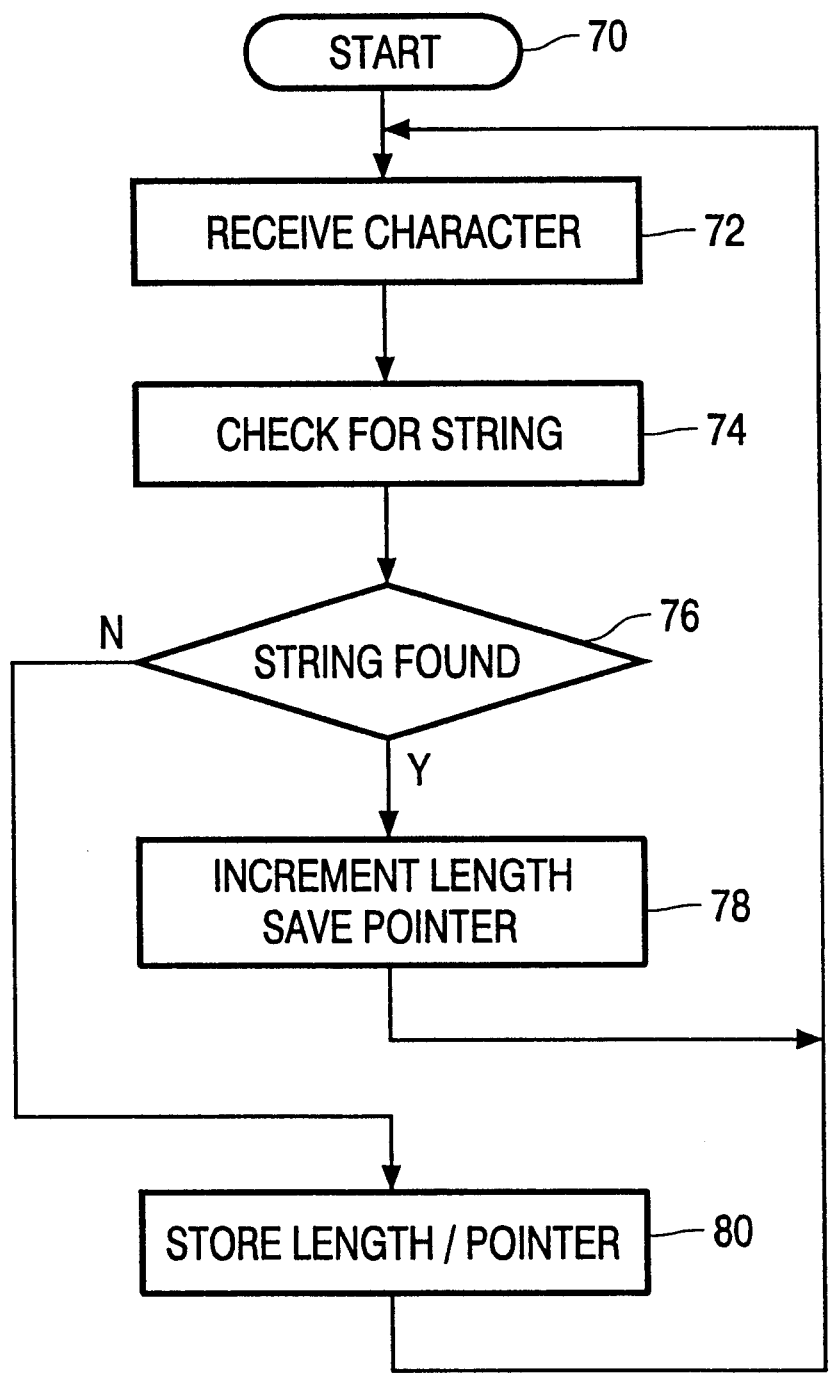
FIG. 8, an encoding flowchart.

FIG. 8 illustrates an encoding flowchart. In block 70, the process is started, and the appropriate amount of hardware and software is assigned. For simplicity, the terminating of the process has not been included in the Figure. In block 72, the next character to be encoded is received. In block 74, the character in question, plus any earlier character in the string that has not been rejected for correspondence with an earlier string in the span of the pointer is checked for such earlier correspondence. In block 76, the test for such correspondence is made. Of course, with the increasing of the string length, the pointer may have to go back still further, because the probability for such correspondence will generally decrease with the stringth's length. If Yes, in block 78, the length is incremented by one and the new pointer is saved, and the system reverts to block 72 in order to try for a still longer string. If No, in block 80 the pre-existing pointer-length pair is stored. Processing for taking into account the difference between uncompacted and compacted data may be effected either during the second pass as discussed above, or rather, through immediate reprocessing the pointer value. Subsequently, the process reverts again to block 72 for undertaking to find the start of a new string.

Figure 9:
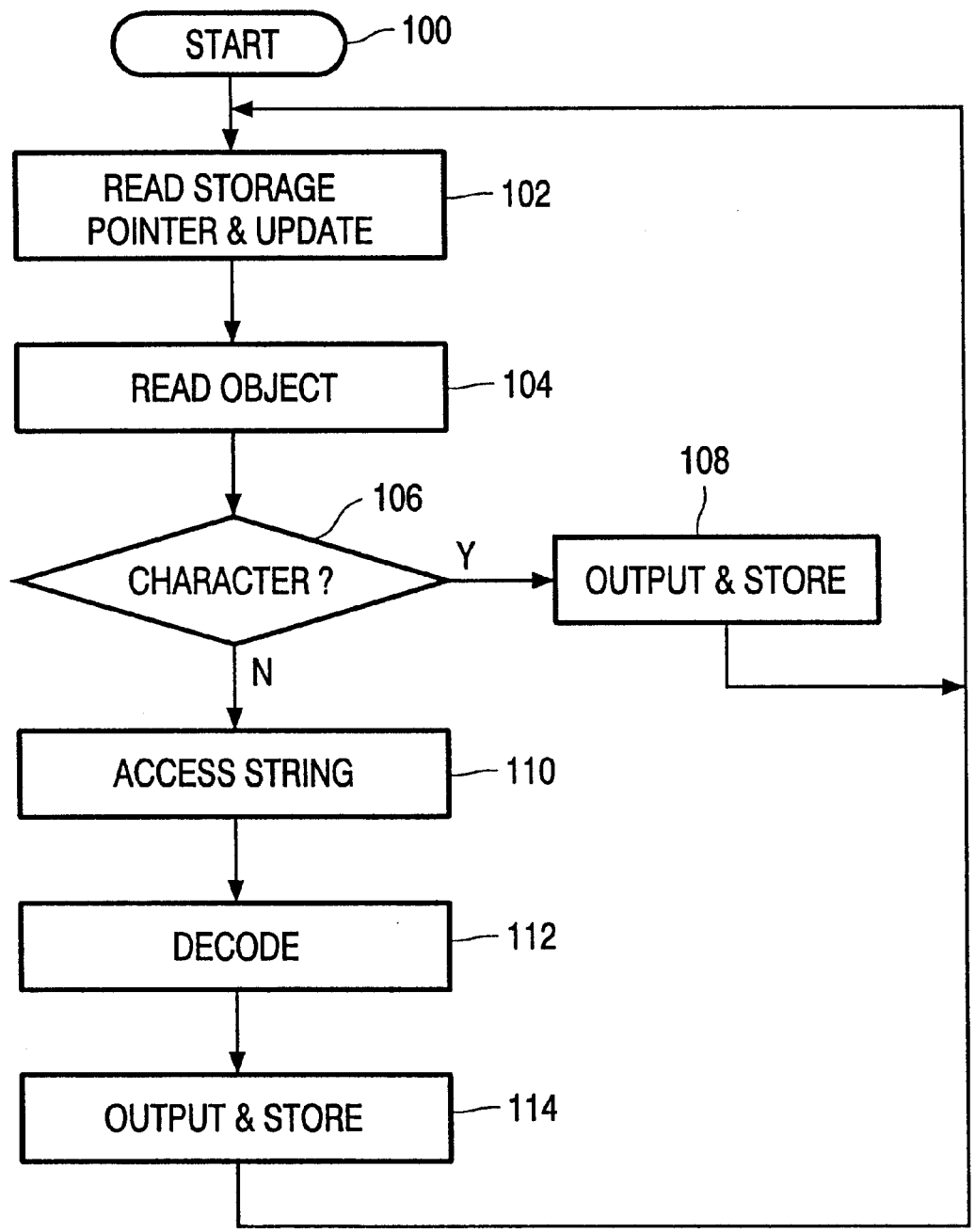
FIG. 9, a decoding flow chart.

FIG. 9 illustrates a decoding flow chart. In block 100, the process is started, and the appropriate amount of hardware and software is assigned. For simplicity, the terminating of the process has not been included in this Figure, either. In block 102, the appropriate storage pointer is read out and updated. In block 104, the associated object is read out. In block 106 the system detects whether the object in question is indeed a character. If Yes, in block 108 the character in question is decoded, outputted and also stored. If No, in block 110 the string pointed at is accessed. Subsequently, the string in question is decoded in block 112. Finally in block 114, the decoded data are output, whereas the encoded string is stored. Next, the system again reverts to block 72.

What is claimed is:

1. A method for executing compression of a data stream through systematically implementing the inserting of regressive pointer-length reference strings along such stream, each such reference indicating the replacing of a particular data string through referring to an associated earlier data string of identical content as said particular data string, said method being characterized by the steps of:

inserting said regressive reference string as referring to an encoded object, through pointing to a pointee object, identifying said regressive reference string through a respectively associated value of a signalling element, as well as identifying unreplaced data through a respectively associated further value of a signalling element, and providing a back-reference scheme for straightforwardly backreferencing to such reference strings.

2. A method as claimed in claim 1, implemented through executing it in a sequence of two steps, wherein a first step will evaluate all back-references and indicate all pointer-line pairs and their associated pointee strings, and a second step will actually replace pointer-line pairs by their pointee strings.

3. A method as claimed in claim 1, wherein such back-reference scheme is provided through effecting such pointing on the level of single bits.

4. A method as claimed in claim 1, wherein such back-reference scheme is provided through effecting such pointing by a pointer that has a standard character length, combined with a string length indication that has a standard character length, plus a discriminatory signalling indication for effecting such pointing.

5. A method as claimed in claim 1, wherein such back-referencing scheme is provided by having such regressive reference strings alternating in sequence with standard characters, whilst suppressing discriminatory indication between such regressive reference strings and standard characters.

6. A method as claimed in claim 1, wherein such back-referencing scheme is provided through providing with a discriminatory indication discriminating between such regressive reference strings and standard characters, and by providing separate storage pointers between a first standard-length part of said regressive reference strings and of said standard characters that contains said discriminatory indication on the one hand, and any remaining part of said regressive reference strings and standard characters, on the other hand.

7. A method as claimed in claim 1, wherein said reference string has a length indication signalling the number of encoded objects.

8. A method as claimed in claim 1, wherein said reference string has a length indication signalling the number of uncoded characters.

9. A method as claimed in claim 1, wherein said reference string comprises a skip element for signalling an initial or terminal sub-length of an associated pointee string that is to be skipped when copying the remainder of that string.

10. A method as claimed in claim 1, whilst specifying the pointer in character units.

11. A compression system being arranged for executing compression of a data stream through inserting means for systematically implementing the inserting of regressive pointer-length reference strings along such stream, each such reference indicating the replacing of a particular data string through referring to an associated earlier data string of identical content as said particular data string, said system being characterized in that:
said inserting means are arranged for inserting said regressive reference string as referring to an encoded object, through pointing to a pointee object, identifying said regressive reference string through a respectively associated value of a signalling element, as well as identifying unreplaced data through a respectively associated further value of a signalling element, and referencing means for providing a back-reference scheme for straightforwardly back-referencing to such reference strings.

12. A system as claimed in claim 11, and having sequencing means that are arranged for implementing said compression in a sequence of two steps, wherein a first step will evaluate all back-references and indicate all pointer-line pairs and their associated pointee strings, and a second step will actually replace pointer-line pairs by their pointee strings.

13. A system as claimed in claim 11, and being arranged for providing such back-referencing scheme through having providing means for providing a discriminatory indication discriminating between such regressive reference strings and standard characters, and by providing separate storage pointers between a first standard-length part of said regressive reference strings and of said standard characters that contains said discriminatory indication on the one hand, and any remaining part of said regressive reference strings and standard characters, on the other hand.

14. An encoding device arranged for use in a system as claimed in claim 11, and comprising inserting means that are arranged for inserting said regressive reference string as referring to an encoded object, through pointing to a pointee object, identifying said regressive reference string through a respectively associated value of a signalling element, as well as identifying unreplaced data through a respectively associated further value of a signalling element, and referencing means for providing a back-reference scheme for straightforwardly backreferencing to such reference strings.

15. A decoding device arranged for use in a system as claimed in claim 11, and having read means for reading said back-reference scheme, replace means for replacing pointer-length pairs through an associated pointee string, and output means for outputting a decoded data stream.

16. A storage medium provided with compressed information produced by a compression method as claimed in claim 1.

* * * * *